United States Patent [19]
Ding et al.

[11] Patent Number: 5,801,959
[45] Date of Patent: Sep. 1, 1998

[54] INTEGRATED CIRCUIT LAYOUT

[75] Inventors: Cheng-Liang Ding, San Jose; Jiabi J. Zhu, Fremont, both of Calif.

[73] Assignee: Silicon Valley Research, Inc., San Jose, Calif.

[21] Appl. No.: 713,597

[22] Filed: Sep. 12, 1996

Related U.S. Application Data

[63] Continuation of Ser. No. 385,157, Feb. 7, 1995, abandoned.

[51] Int. Cl.$^6$ .................................................. G06F 17/50
[52] U.S. Cl. ........................... 364/491; 364/489; 364/490
[58] Field of Search ................................. 364/489, 490, 364/491

[56] References Cited

U.S. PATENT DOCUMENTS

| | | | |
|---|---|---|---|
| 4,577,276 | 3/1986 | Dunlop et al. | 364/491 |
| 4,613,941 | 9/1986 | Smith et al. | 364/490 |
| 4,615,011 | 9/1986 | Linsker | 364/491 |
| 4,754,408 | 6/1988 | Carpenter et al. | 364/491 |
| 4,815,003 | 3/1989 | Putatunda et al. | 364/491 |
| 4,823,276 | 4/1989 | Hiwatashi | 364/491 |
| 4,831,725 | 5/1989 | Dunham et al. | 29/847 |
| 4,835,705 | 5/1989 | Fujino et al. | 364/491 |
| 4,908,772 | 3/1990 | Chi | 364/491 |
| 4,965,739 | 10/1990 | Ng | 364/491 |
| 4,975,854 | 12/1990 | Yabe | 364/491 |
| 5,072,402 | 12/1991 | Ashtaputi et al. | 364/491 |
| 5,309,370 | 5/1994 | Wong | 364/490 |
| 5,363,313 | 11/1994 | Lee | 364/491 |

FOREIGN PATENT DOCUMENTS

| | | | |
|---|---|---|---|
| 0 294 188 A3 | 12/1988 | European Pat. Off. | G06F 15/60 |
| WO 91/06061 | 5/1991 | WIPO | G06F 15/60 |

OTHER PUBLICATIONS

James Reed, "A New Symbolic Channel Router: YACR2", IEEE Transactions on Computer-Aided Design, vol. CAD-4, No. 3, Jul. 1985, pp. 208-219.

W. Heyns et al., "Recursive channel router", 25th ACM/IEEE Design Automation Conference, Paper 14.1, 1988, pp. 178-182.

B. Preas et al., Chapters 4 and 5 of *Physical Design Automation of VLSI Systems*, The Benjamin/Cummings Publishing Company, Inc., 1988, pp. 87-210.

Secker et al., "TimberWolf 3.2: A New Standard Cell Placement and Global Route Package," IEEE, 1986, pp. 432-439.

*Primary Examiner*—Kevin J. Teska
*Assistant Examiner*—Thai Phan
*Attorney, Agent, or Firm*—Gray Cary Ware & Freidenrich

[57] ABSTRACT

The invention quickly produces a dense layout for an integrated circuit that enables a smaller die to be used to implement the integrated circuit than would otherwise be the case, resulting in a desirable size reduction in the final packaged integrated circuit. The invention combines routing space estimation and adjustment (a technique similar to channel-based global routing) with area-based detailed routing, resulting in an approach that provides the benefits of both channel-based and area-based layout techniques while minimizing the disadvantages of those techniques.

28 Claims, 9 Drawing Sheets

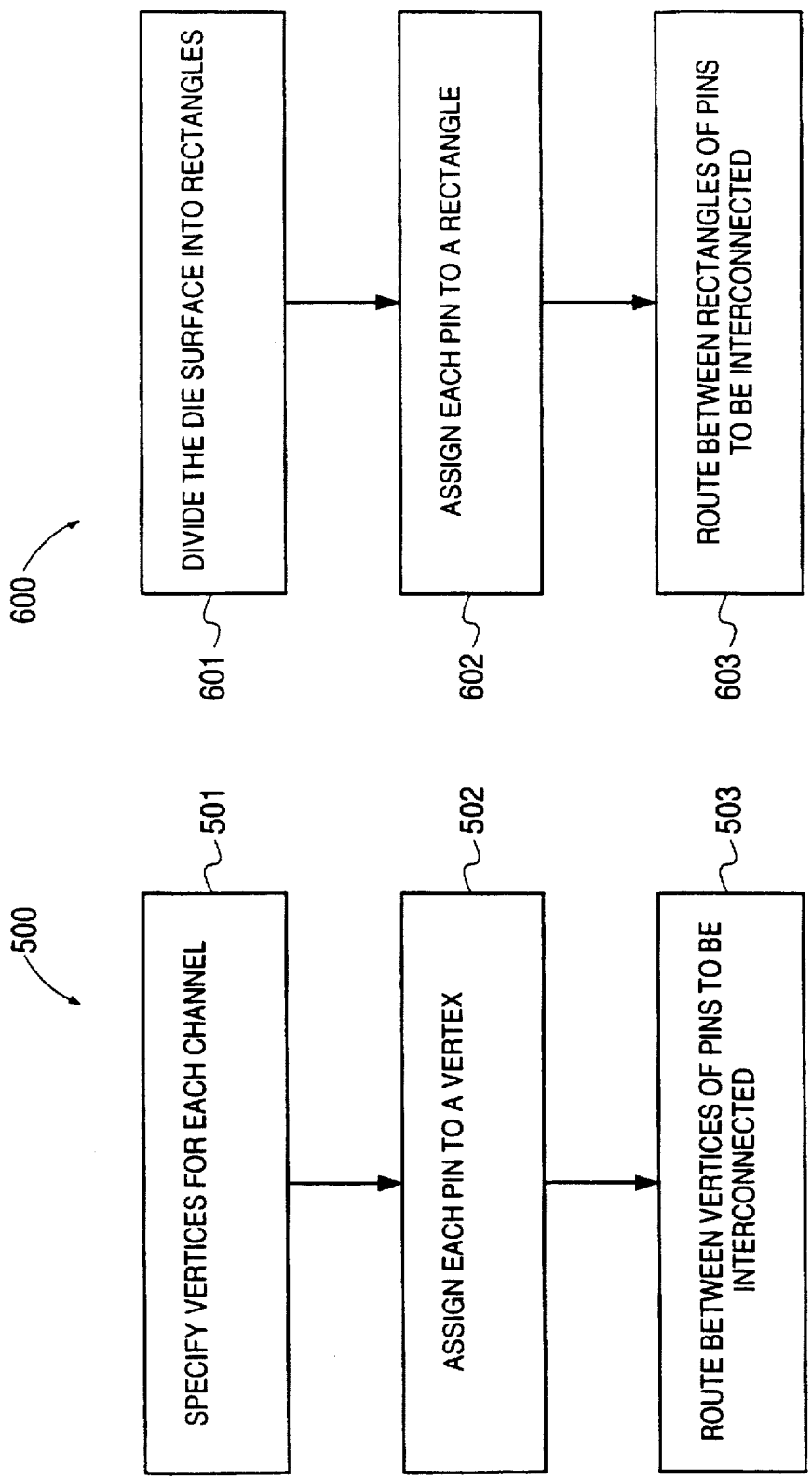

INTEGRATED CIRCUIT LAYOUT

This application is a continuation of application Ser. No. 08/385,157, abandoned now, filed Feb. 7, 1995.

BACKGROUND OF THE INVENTION

1. Field of the Invention

This invention relates to determination of a layout of integrated circuit components on a semiconductor die.

2. Related Art

Integrated circuit chips are produced to perform particular functions or sets of functions. The first step in producing the chip is establishing an integrated circuit design that achieves the desired functionality. The integrated circuit design includes specification of particular electrical components (cells and blocks), as well as the interconnections (traces and vias) that must be made between various components.

Once the integrated circuit design is complete, the design must be implemented on a semiconductor die to make an integrated circuit chip. Part of this implementation is the specification of the location of the components and interconnections on the die ("layout"). The first step in this specification is the determination of the location of the components on the die ("placement"). After component placement, the location of the component interconnections is determined ("routing").

Previously, integrated circuit layout has been accomplished using one of two techniques: channel-based layout or area-based layout. In channel-based layout, as a result of component placement, components are located on a die surface as blocks and rows of cells. A defined distance between adjacent cell rows, adjacent blocks, or adjacent blocks and cell rows is termed a "channel." A defined distance between adjacent cells in a row is termed a "cell spacing." A first, global routing step produces a rough specification of the locations of the interconnections between components. A second, detailed routing step produces the final detailed specification of the locations of the component interconnections. In channel-based layout, most of the routing is done along the channels; some may be done in the spaces between cells. Channel-based layout typically adjusts the routing resources (i.e., the size of the channels and the cell spacings), and, in some cases, the size of the die, as necessary to meet the routing demand (i.e., space requirements for the interconnections). Since channel-based layout adjusts the routing resources as necessary, a routing solution is guaranteed.

Channel-based layout has the advantage that only one layout iteration need be performed to produce a workable layout, enabling a layout to be determined quickly. However, channel-based layout generally does not produce a layout that minimizes the die size required to implement the layout (i.e., circuit density is not maximized). Further, it is difficult to implement minor changes to the integrated circuit design after a layout has been established.

In area-based layout, unlike channel-based layout, typically component placement results in blocks and cells being located anywhere on the die surface in any arrangement, rather than being arranged in blocks and cell rows with defined channels. In area-based layout, a global routing step may precede a detailed routing step, or the detailed routing may be done directly using the component placement specification. Unlike channel-based layout, in area-based layout, the routing is not confined to channels and cell spacings, but rather can be done anywhere over the die surface. Further, unlike channel-based layout, area-based layout assumes a fixed area (i.e., die size) within which the routing must be accomplished. Since the die size, and, thus, the routing resources, is fixed, area-based layout may require several iterations to determine a routing solution and may, in fact, not find a routing solution for that die size.

Area-based layout has the advantage that the die size necessary to implement the layout for a particular integrated circuit design is minimized (i.e., the circuit density is maximized). Further, it is easier to implement minor changes to the integrated circuit design after a layout has been established than it is when channel-based layout is used. However, area-based layout typically requires several layout iterations to produce a workable layout. Thus, determination of a layout takes a long time, usually much longer than determination of a layout using channel-based layout. Further, it is difficult to know what die size should be assumed at the beginning of the layout procedure. Assuming a size that is too small increases the iterations needed to determine a routing solution and assuming a size that is too large makes the die unnecessarily large.

It would be desirable to have an integrated circuit layout technique that produces layouts that minimize die size without requiring a prohibitively long time to complete. Such a layout would easily accommodate minor changes to the integrated circuit design after a layout has been established without requiring extensive revision of the layout. Such a layout technique would desirably be applicable to layouts including any organization of components, including cell rows and blocks. The layout technique would also be adaptable to fixed die sizes and fixed I/O constraints.

SUMMARY OF THE INVENTION

For a specified integrated circuit design, the invention produces a dense integrated circuit layout in a short time. The dense layout enables the integrated circuit design to be implemented on a smaller semiconductor die than would otherwise be the case, resulting in a desirable size reduction in the final packaged integrated circuit. The invention combines routing space estimation and adjustment (a technique similar to channel-based global routing) with area-based detailed routing to produce the layout. The invention provides many of the benefits of both channel-based and area-based layout techniques while minimizing the disadvantages of those techniques.

First, an integrated circuit design is developed that includes specification of particular components (cells and blocks) as well as the interconnections that must be made between various components. Most of the components include at least one pin for accepting an input electrical signal to the component and many also include at least one additional pin for providing an output electrical signal from the component. The interconnections are made between pins of different components.

Once the integrated circuit design has been established, the layout of the components and interconnections of the design must be determined so that the components and interconnections can be produced on the surface of a semiconductor die. Sometimes, the integrated circuit design must be implemented on a die of a specified size (i.e., having a particular surface area). Other times, the approximate size of the die required to implement the integrated circuit design can be estimated. In any event, a die size is assumed prior to beginning determination of the integrated circuit layout.

In one embodiment of the invention, a method for determining an integrated circuit layout on a surface of a semiconductor die includes the steps of: i) determining the placement of each component on the die surface, ii) performing routing space estimation and adjustment to approximately define the routing demand, and iii) performing area-based detailed routing to exactly define the path of each interconnection on the die surface. Together, the routing space estimation and adjustment step and the component placement step define a die size that may or may not be the same as the die size specified prior to implementing the layout method of the invention. This later determined die size does not change as a result of the area-based detailed routing step.

The invention can produce, in almost all cases, a routing solution in one iteration. Further, the solution produced is usually a relatively dense solution. In contrast, conventional area-based layout typically requires more than one iteration to produce a solution. Channel-based layout, while capable of producing a solution in one iteration, typically does not provide a particularly dense solution.

Moreover, in a particular embodiment of the invention, an iterative method can be used to achieve very small die sizes for a particular integrated circuit design. In contrast, in channel-based layout, such an iterative approach would not produce a reduced die size, since the channel-based detailed routing would undo any reductions in routing resources. Further, in area-based layout, such an iterative approach could not be used since there is no way to systematically change the routing resources.

In another particular embodiment, the invention has the capacity for developing a layout for a fixed die size and fixed I/O constraints (either for the die or for a block on the die).

The invention is applicable to layout on a die surface of integrated circuit designs that include only rows of cells, rows of cells and blocks, or only blocks. Further, the invention is also applicable to the layout of a single block. Though, typically, integrated circuits are implemented on rectangular (including square) die, the invention is applicable to integrated circuit layout on a die surface of any contour.

BRIEF DESCRIPTION OF THE DRAWINGS

FIG. 5 is a block diagram of a routing method that can be used with the invention to perform routing space estimation and adjustment.

FIG. 6 is a block diagram of another routing method that can be used with the invention to perform routing space estimation and adjustment.

DETAILED DESCRIPTION OF EMBODIMENTS OF THE INVENTION

The invention combines routing space estimation and adjustment (a technique similar to channel-based global routing) with area-based detailed routing to quickly produce a dense integrated circuit layout that enables relatively small die to be used to implement the integrated circuit. The invention provides many of the benefits of both channel-based and area-based layout techniques while minimizing the disadvantages of those techniques.

Prior to using the invention to determine the layout, an integrated circuit design is established that accomplishes a desired set of functions. The integrated circuit design includes a specification of particular components, as well as the interconnections that must be made between various components. The components include cells (e.g., a two-input NAND gate, an OR gate or a flip-flop) and blocks (e.g., RAM, ROM or CPU). Most of the components include at least one pin for accepting an input electrical signal to the component. Many of the components also include at least one additional pin for providing an output electrical signal from the component. Components can include more than two pins and can have more than one input pin and more than one output pin. There can also be components that have no pins; these components are used to "reserve" space within the integrated circuit layout to accommodate anticipated possible revisions to the integrated circuit design. The interconnections are made between pins of different components. The list of pins and corresponding pin or pins to which connection is to be made is called a "net list."

Once the integrated circuit design is established and the net list created, an integrated circuit layout is determined. To provide a starting point for determination of the layout, a die surface of a specified size is assumed. However, the invention may, and typically will, result in an integrated circuit layout that requires a larger or smaller size die surface than that originally assumed.

Figure 1:
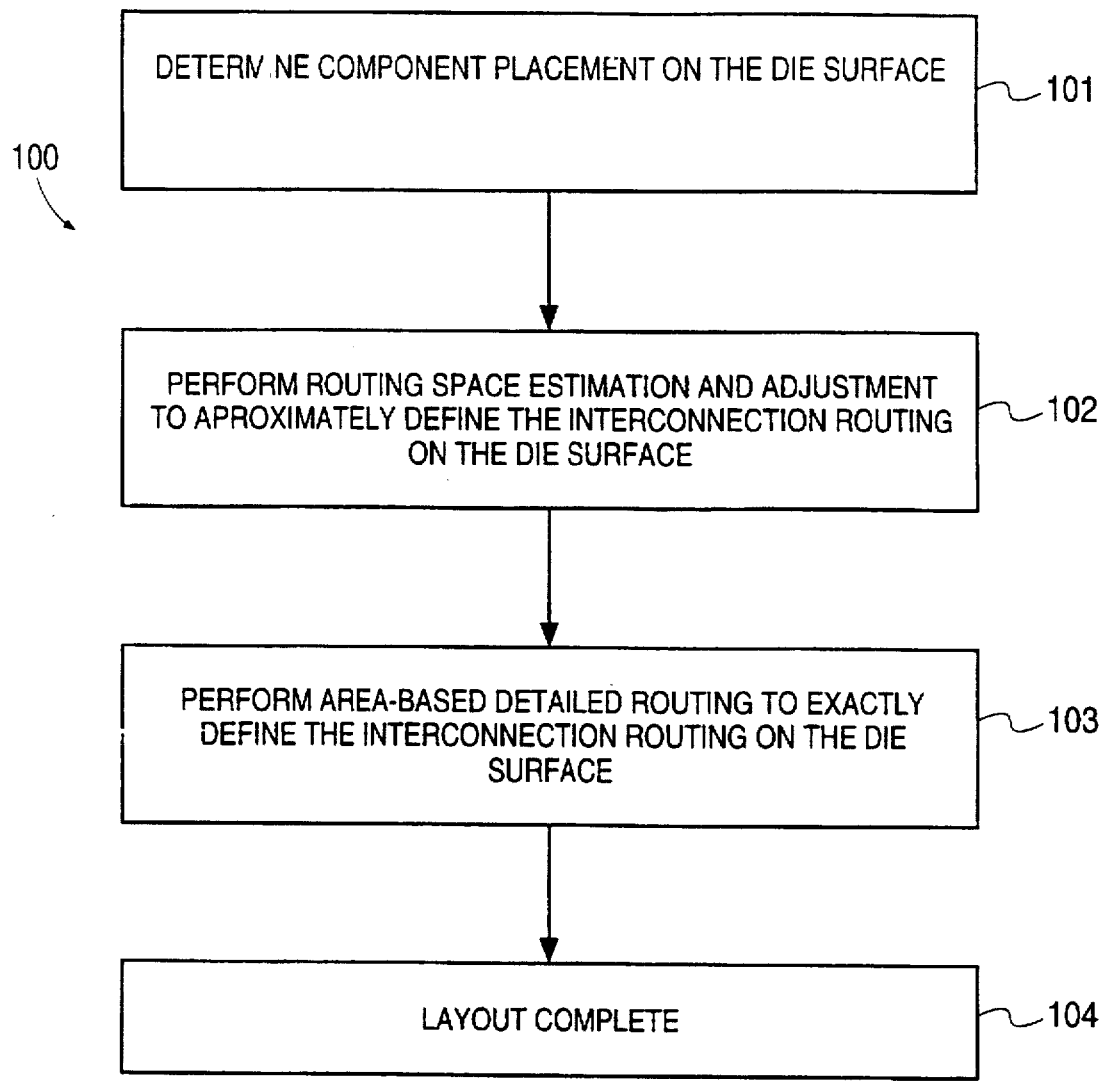
FIG. 1 is a block diagram of an integrated circuit layout method according to one embodiment of the invention.

FIG. 1 is a block diagram of an integrated circuit layout method 100 according to one embodiment of the invention. In step 101, the placement (location) of each component on the die surface is determined. According to the invention, the component placement step can result in placement of cell rows only, in placement of cell rows and blocks, or in placement of blocks only.

After component placement is determined, the interconnections between pins of components are routed. According to the invention, the interconnection routing includes routing space estimation and adjustment (step 102) followed by area-based detailed routing (step 103).

The routing space estimation and adjustment step 102 approximately defines the routing of each interconnection on the die surface or, in other words, approximately defines the routing demand (i.e., space requirements for interconnections). The routing space estimation and adjustment step 102 uses the component placement determined in step 101 as a starting point. As explained in more detail below, during the routing space estimation and adjustment step 102, the placement of components on the die surface can be varied, either by varying channel height (defined below) or by varying channel height and cell spacing (also defined below) to increase, decrease or merely reallocate the routing resources (i.e., available space for routing) as appropriate. This change in the routing resources can cause the size of the die surface to change, either increasing or decreasing.

The routing space estimation and adjustment step 102 includes both estimation of the location of the interconnections and adjustment of the routing resources available for routing the interconnections. Some channel-based global routing methods can be used to implement the routing space estimation and adjustment step 102; specifically, those that include both estimation of the location of the interconnections and adjustment of the routing resources (some channel-based global routing methods include only estimation of the location of the interconnections). Either gridded channel-based global routing or gridless channel-based global routing can be used.

Figure 2A:
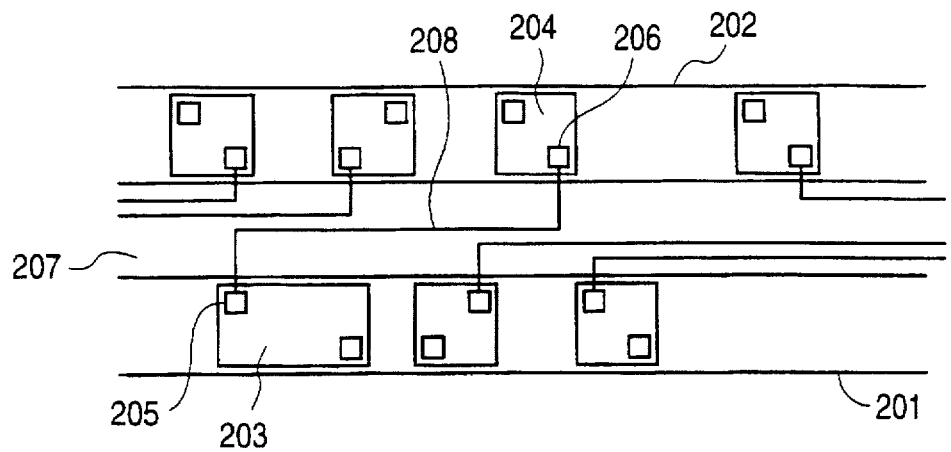
FIG. 2A illustrates gridless channel-based routing.

FIG. 2A illustrates gridless channel-based routing. Cell rows 201 and 202 are formed proximate to each other. A channel 207 is defined between the cell rows 201 and 202. Interconnections are routed from a pin on one cell to a pin on another cell via the channel 207, e.g., the pin 205 on the cell 203 is connected to the pin 206 on the cell 204 by the interconnection 208. The definition of the channel 207 defines the space available for routing the interconnections between cells. Gridless channel-based global routing is known to those skilled in the art. One type of gridless channel-based global routing is described in "Recursive Channel Router," by W. Heyns and K. Van Nieuwenhove, 25th Design Automation Conference, 1988, the disclosure of which is incorporated by reference herein.

Figure 2B:
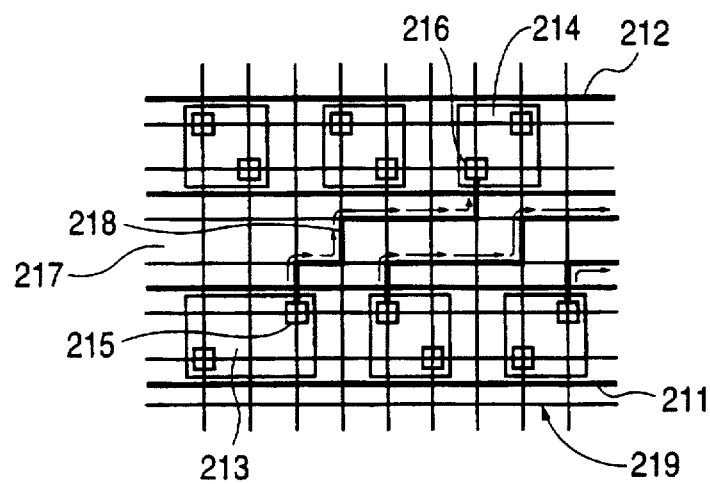
FIG. 2B illustrates gridded channel-based routing.

FIG. 2B illustrates gridded channel-based routing. Again, cell rows 211 and 212 are formed proximate to each other and a channel 217 is defined between the cell rows 211 and 212. However, interconnections are routed from a pin on one cell to a pin on another cell along grid lines of a routing grid 219, e.g., the pin 215 on the cell 213 is connected to the pin 216 on the cell 214 by the interconnection 218, rather than in any available space within the channel 217. The grid lines of the routing grid 219 define the space available for routing the interconnections between cells. In order to achieve optimum routing results, pin locations should be specified during the integrated circuit design so that that they are located at the intersections of grid lines. Gridded channel-based global routing is known to those skilled in the art. One type of gridded channel-based global routing is described in "A New Symbolic Channel Router: YACR2," by James Reed, Alberto Sangiovanni Vincentelli and Mauro Santomauro, IEEE Transactions on Computer-Aided Design, Vol. CAD-4, No. 3, July 1985, the disclosure of which is incorporated by reference herein.

The area-based detailed routing step 103 exactly defines the location of each interconnection on the die surface, as explained in more detail below. The area-based detailed routing step 103 uses the component placement and die size determined as a result of the routing space estimation and adjustment step 102 as a starting point. The size of the die surface remains constant during the area-based detailed routing step 103. However, since the routing space estimation and adjustment step 102 adjusts the size of the die surface to accommodate the needed routing resources, the area-based detailed routing step 103 can almost always produce a routing solution for the die surface size and component placement existing at the beginning of the area-based detailed routing step 103.

Figure 2C:
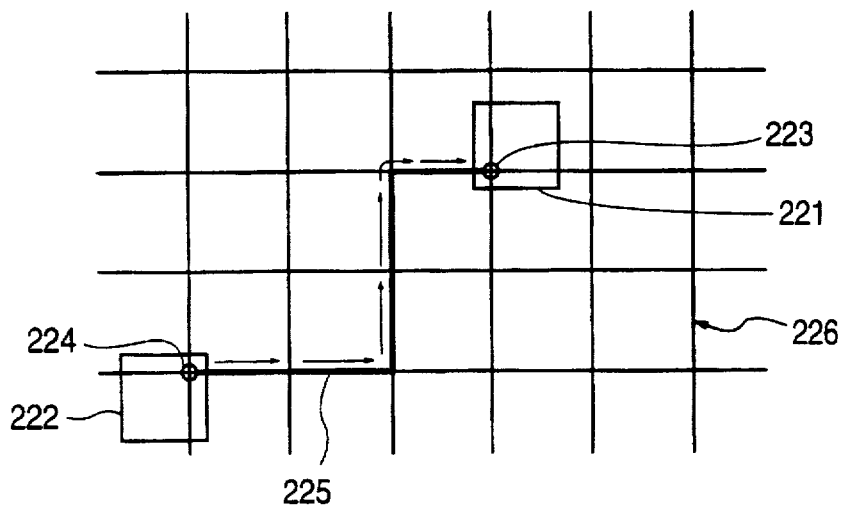
FIG. 2C illustrates area-based routing.

FIG. 2C illustrates area-based routing. Unlike channel-based routing, in area-based routing, the cells and blocks need not be arranged in rows. In FIG. 2C, a pin 223 of a cell 221 is connected to a pin 224 of a cell 222 by an interconnection 225. The location of the interconnection 225 is constrained only by the routing grid 226 that is superimposed on the die surface. The interconnection 225 must follow a path along the grid lines of the routing grid 226. In order to achieve optimum routing results, pins are desirably located at the intersections of grid lines. The details of implementing area-based routing are known to those skilled in the art.

The integrated circuit layout method 100 produces, in almost all cases, a routing solution after one iteration of the method 100. This is a consequence of the adjustment of routing resources in the routing space estimation and adjustment step 102. Further, the solution produced is usually a relatively dense solution. This is a consequence of the area-based detailed routing step 103. In contrast, conventional area-based layout typically requires more than one iteration to produce a solution, thus taking a longer time to produce a layout than the method of the invention. Channel-based layout, while capable of producing a solution in one iteration, typically does not provide a particularly dense solution, thus resulting in a die size that is larger than necessary.

Additionally, since the method 100 includes area-based detailed routing, it is relatively easy (i.e., as easy as is the case with area-based layout and easier than is the case with channel-based layout) to implement minor changes to the integrated circuit design after a layout has been established.

In the integrated circuit layout method 100, after the area-based detailed routing step 103, the integrated circuit layout is complete, as indicated by block 104 in FIG. 1. The integrated circuit layout method 100 quickly determines a dense layout for an integrated circuit design. However, it may be that the determined layout could be made even denser (and, thus, the die size smaller). This could be determined, for example, by a visual inspection of the layout determined by the method 100. According to other embodiments of the invention, the layout can be made even denser by iteratively performing the step of area-based detailed routing (step 103).

Figure 3:
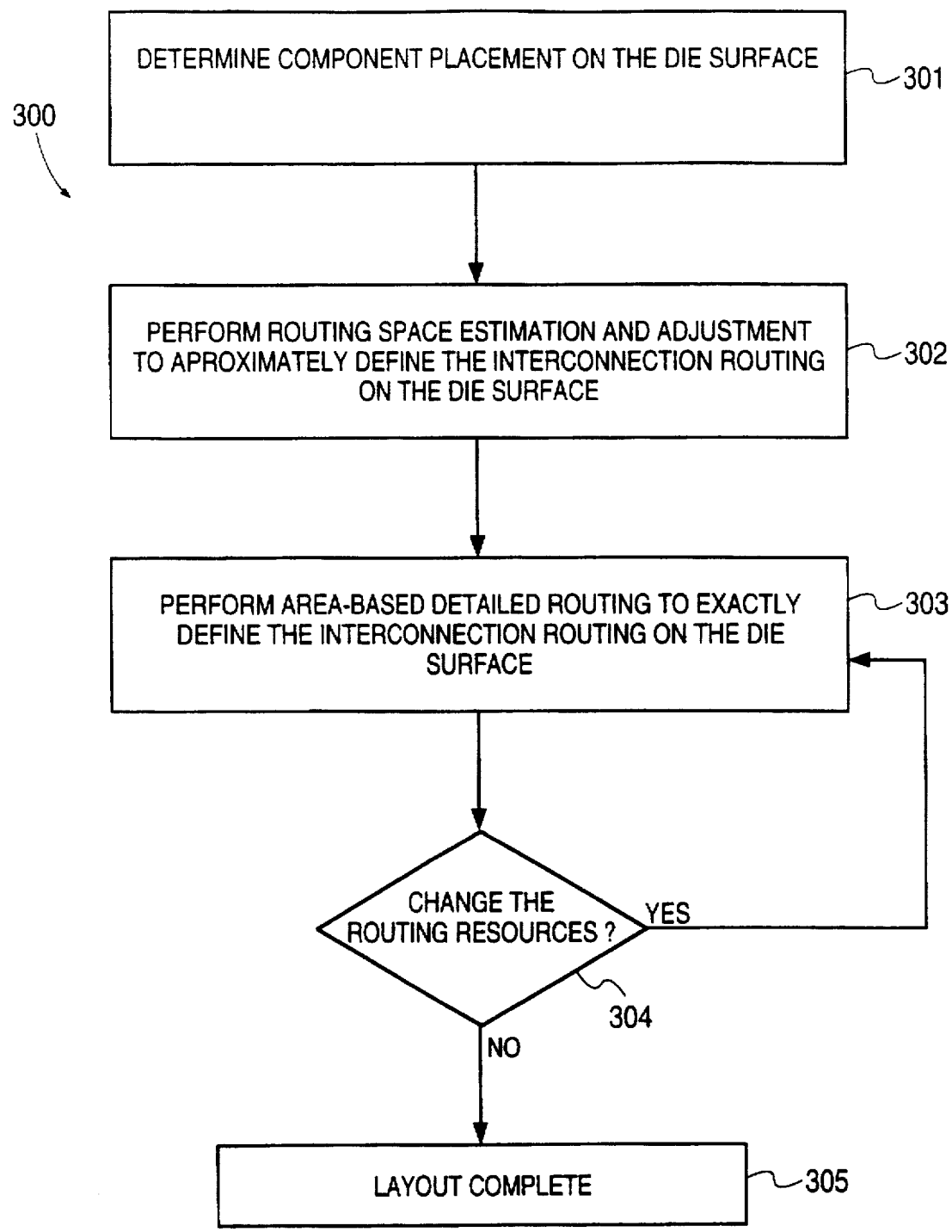
FIG. 3 is a block diagram of an integrated circuit layout method according to another embodiment of the invention.

FIG. 3 is a block diagram of an integrated circuit layout method 300 according to another embodiment of the invention. The steps 301, 302 and 303, and the block 305 correspond to the steps 101, 102 and 103, and the block 104 of the method 100 of FIG. 1 and are discussed above.

Unlike the method 100, the method 300 includes the step 304 in which, after the area-based detailed routing step 303, the routing resources can be changed. If the routing resources are changed, then the area-based detailed routing step 303 is performed again. The routing resources can be changed by changing the area of the die surface (and, as a result, the channel heights and/or cell spacings), changing the channel height of one or more channels, or changing one or more cell spacings. Two or more of these changes can be combined. The step 304 is enabled by storing the information regarding channel heights and cell spacings determined in the routing space estimation and adjustment step 302. This information is then used as a basis for changing some or all of the channel height and cell spacing magnitudes (and, consequently, the component locations) in response to the specified changes in channel height, cell spacing or die size. The sequence of steps 303 and 304 can be performed any number of times until a satisfactory layout is achieved.

The iterative method 300 can be used to achieve very small die sizes for a particular integrated circuit design. In contrast, in channel-based layout, attempting to perform detailed routing iterations by changing routing resources before each detailed routing would not produce a reduced die size, since the channel-based detailed routing would undo any reductions in channel height or cell spacing. Further, it would not be possible to perform such iterations with area-based layout, since the routing resources are not sufficiently well defined (e.g., in channels) to enable a systematic change in the routing resources prior to each iteration.

In another embodiment of the invention, a layout is determined by iteratively performing each of the component placement, routing space estimation and adjustment, and area-based detailed routing steps.

As indicated above, a method according to the invention begins with a determination of the placement of each component on the die surface (e.g., steps 101 and 301 in FIGS. 1 and 3, respectively). The component placement step can be implemented using any of a number of well-known techniques. For example, component placement can be done using simulated annealing, a min-cut method, or a force-directed method. A discussion of these techniques can be found in, for instance, Chapter 4 of *Physical Design Automation of VLSI Systems*, by Bryan Preas and Michael Lorenzetti, The Benjamin/Cummings Publishing Co., Inc., 1988, the pertinent disclosure of which is incorporated herein by reference.

Figure 4:
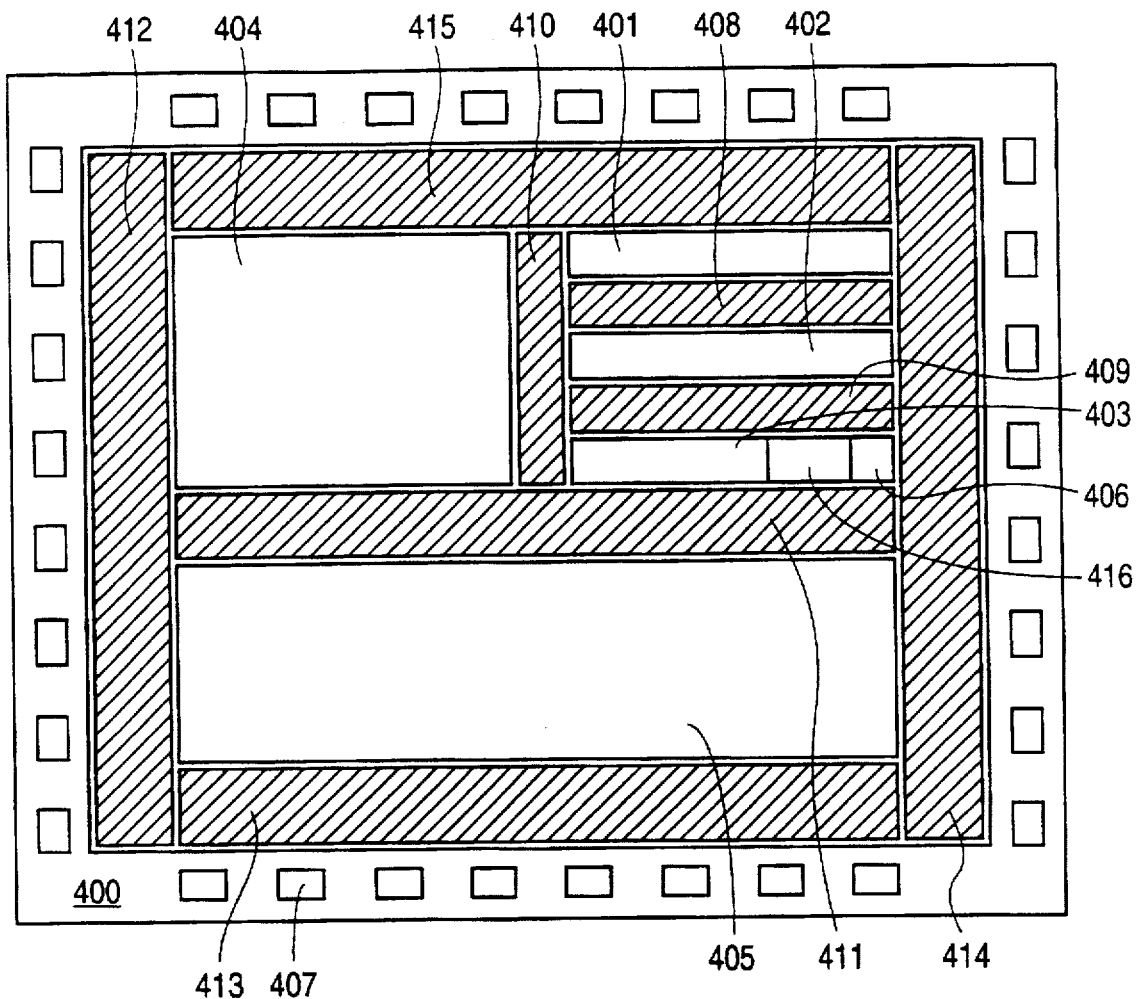
FIG. 4 is a simplified plan view of a die surface after the component placement step of the method of FIG. 1 or FIG. 3.

FIG. 4 is a simplified plan view of a die surface 400 as the die surface 400 might look after the component placement step of a method according to the invention. It is to be understood that the method according to the invention does not include forming the components on a die surface; FIG. 4 merely illustrates the state of the integrated circuit layout as represented by the component placement information. Further, here and elsewhere, the usage of terms such as "bottom," "top," "right," "left," "horizontal," and "vertical" is to be understood only as a convenient manner of denoting a relationship in the figure being discussed and not as a limitation on the structure being discussed.

Cell rows 401, 402, 403 and blocks 404, 405 are formed on the die surface 400. Cells and blocks are qualitatively similar: a block can be thought of as a large cell. As mentioned above, a cell can be, for instance, a two-input NAND gate, an OR gate or a flip-flop. A block can be, for instance, a RAM, ROM or CPU. Further, a block can include cells or sub-blocks which, in turn, include cells. This nested classification scheme can, theoretically, include any number of levels.

In FIG. 4, cell rows 401, 402, 403 are shown extending horizontally across the die surface 400. Cell rows could also extend vertically across the die surface 400.

The cells in the cell rows 401, 402 or 403 and blocks 404 and 405 are called "internal cells." For simplicity, individual cells are not shown in FIG. 4, with the exception of cells 406 and 416 of cell row 403 which are shown for illustrative purposes. As can be seen by comparing cells 406 and 416, the internal cells need not, and often do not, have the same size.

A multiplicity of conventional input and output (I/O) cells, e.g., I/O cell 407, are formed around the periphery of the die surface 400 surrounding the cell rows 401, 402, 403 and blocks 404, 405. The I/O cells represent connection points for making electrical connection from electronic components off the die surface 400 to the cells and blocks on the die surface 400. Like the internal cells, the I/O cells may be of different sizes.

A "channel" is a defined distance between adjacent cell rows or blocks. For example, channel 408 is formed between cell row 401 and 402; channel 409 is formed between cell row 402 and 403; channel 410 is formed between cell rows 401, 402 and 403 and block 404; and channel 411 is formed between block 405, and block 404 and cell row 403. There are also channels formed between the I/O cells and the internal cells, i.e., channels 412 through 415. Each channel has a channel height (i.e., the "width" of the channel). Channel heights (and cell spacings, discussed below) are used as part of the representation of routing resources. The channel height magnitudes can vary in any manner over the die surface.

In actual production of the integrated circuit chip which includes the integrated circuit layout determined by the method of the invention, the component interconnections are usually primarily done in metal layers (layers of electrically insulative material which include electrically conductive interconnections and, in some cases, components or parts of components) that are formed above or below the die surface on which the components are formed. Typically 2, 3 or 4 metal layers are used, though other numbers of layers are possible. Thus, in total, the routing resources of a die are defined by, in addition to the channel heights and cell spacings, the number of metal layers and the design rules (e.g., interconnection spacing, available capacity within each channel) for each metal layer.

A channel can be defined even between cell rows or blocks that are immediately adjacent each other on the die surface on which the components are formed. This is because, as described above, the interconnections are usually done on one or more metal layers. Thus, interconnections can be made over or under a block or cell row. The function of the channel is, as outlined above, simply to provide a definition of the available routing resources.

Channels (and channel heights) can be defined in any of a number of ways; the definition is constrained only by the channel definition requirements of the routing method being used. For example, the channel 408 between the cell rows 401 and 402 could be defined as the region between the centerlines of the cell rows 401 and 402. Alternatively, the channel 408 could be defined as the region between the bottom edge of the cell row 401 and the top edge of the cell row 402. The channel 410 could be defined as the region between the right edge of the block 404 and one or more of the left edges of the cell rows 401, 402 and 403. The channel 411 could be defined as the region between a line coincident with the bottom edge or the centerline of the cell row 403, and the top edge of the block 405. It is also possible that channels have an irregular rectangular shape. For example, channel 411 might be defined as the combination of two regions: one between the centerline of the cell row 403 and the centerline of the block 405 and another between the centerline of the block 404 and the centerline of the block 405. The interface of these regions could be defined to be at, for example, the centerline of the channel 410, at the right edge of the block 404 or at the left edge of one of the cell rows 401, 402 or 403.

A cell spacing exists between each pair of adjacent cells in the same cell row. Like channel height, cell spacing can be defined in any one of a number of ways; again, the definition is constrained only by the cell spacing definition requirements of the routing method being used. For example, in a cell row, the cell spacing could be defined as the distance between the centerlines (in a direction perpendicular to the centerline of the cell row) of the cells or the distance between the proximal edges of the cells. More generally, the cell spacing could be defined as the distance between the centroid (of the area defined by the edges of the cell) of one cell and the centroid of an adjacent cell. The magnitude of the cell spacing between cells can vary in any manner over the die surface and can be zero.

As indicated above, following component placement, routing space estimation and adjustment is performed to define the approximate space necessary for interconnections (i.e., routing demand). The routing demand definition is manifested as specified magnitudes for channel heights and cell spacings. These channel height and cell spacing magnitudes can be, and often are, different than the corresponding channel height and cell spacing magnitudes that existed after the component placement step. The routing space estimation and adjustment step can also result in a change in the die size, either an increase or a decrease. As explained below, routing space estimation and adjustment can be accomplished using any of a number of techniques.

FIG. 5 is a block diagram of a routing method 500 that can be used with the invention to perform routing space estimation and adjustment. The routing method 500 is termed "channel-graph global routing," and is well-known to those skilled in the art of routing. Channel-graph global routing is described in more detail in, for example, the Preas and Lorenzetti reference, the pertinent disclosure of which is incorporated by reference herein.

In step 501, for each channel, the location of one or more vertices within the channel is specified. Generally, the number of vertices for each channel can be specified independently of the number of vertices specified for other channels. Any number of vertices can be specified for a channel. Different channels can have different numbers of vertices and, moreover, the number of vertices in each channel need not be proportional to the size of the channel. The larger the number of vertices specified for each channel, the more accurate the routing result produced by the routing method 500 and, consequently, the greater the likelihood that the subsequent detailed routing will produce a routing solution. However, as the number of vertices increases, the time required to perform the routing method 500 increases. Thus, the number of vertices chosen involves a trade-off between the accuracy of the routing space estimation and adjustment result, and the time required to complete the routing method 500.

In step 502, each pin is assigned to a vertex. Thus, the interconnections between pins can be viewed as interconnections between vertices. Generally, a pin is assigned to the vertex closest to the pin.

In step 503, the interconnections between vertices are routed. Since multiple pins are associated with each vertex, the resultant routing will, of necessity, not represent an exact routing solution, but rather an approximation of an exact routing solution. The interconnections between vertices can be routed using one of a number of well-known techniques. For example, maze routing or line-probe routing could be used. These techniques are described in, for instance, the Preas and Lorenzetti reference, the pertinent disclosure of which is incorporated herein by reference.

FIG. 6 is a block diagram of a routing method 600 that can be used with the invention to perform routing space estimation and adjustment. The routing method 600 is termed "coarse grid global routing," and is well-known to those skilled in the art of routing. Coarse grid global routing is described in more detail in, for example, the Preas and Lorenzetti reference, the pertinent disclosure of which is incorporated by reference herein.

In step 601, the die surface is divided into a multiplicity of rectangles. The rectangles need not all be the same size. Similarly to the specification of vertices in the routing method 500 (FIG. 5), the number of rectangles into which the die surface is divided represents a trade-off between the accuracy of the routing space estimation and adjustment result, and the time required to complete the routing method 600.

In step 602, each pin is assigned to a rectangle. Thus, the interconnections between pins can be viewed as interconnections between rectangles. Generally, a pin is assigned to the rectangle within which the pin is located.

In step 603, the interconnections between rectangles are routed. Similar to the routing method 500, since multiple pins are associated with each rectangle, the resultant routing represents an approximate rather than an exact routing solution. The interconnections between rectangles can be routed using one of a number of well-known techniques. For example, maze routing is often used. Line-probe routing could also be used.

Any of a number of other well-known techniques can also be used with the invention to perform routing space estimation and adjustment.

After routing space estimation and adjustment, area-based detailed routing is used to define the exact path of the interconnections. Generally, the definition of the path requires specifying the layer on which each interconnection trace is located (if applicable), the location of the trace on the layer, and the location of vias that make connection between layers (if applicable). Area-based detailed routing can be implemented in any of a variety of well-known ways for use with the invention. According to one embodiment, the area-based detailed routing step is implemented using a line-probe technique (similar to the line-probe technique that can be used for routing space estimation and adjustment, as discussed above).

Figure 7:
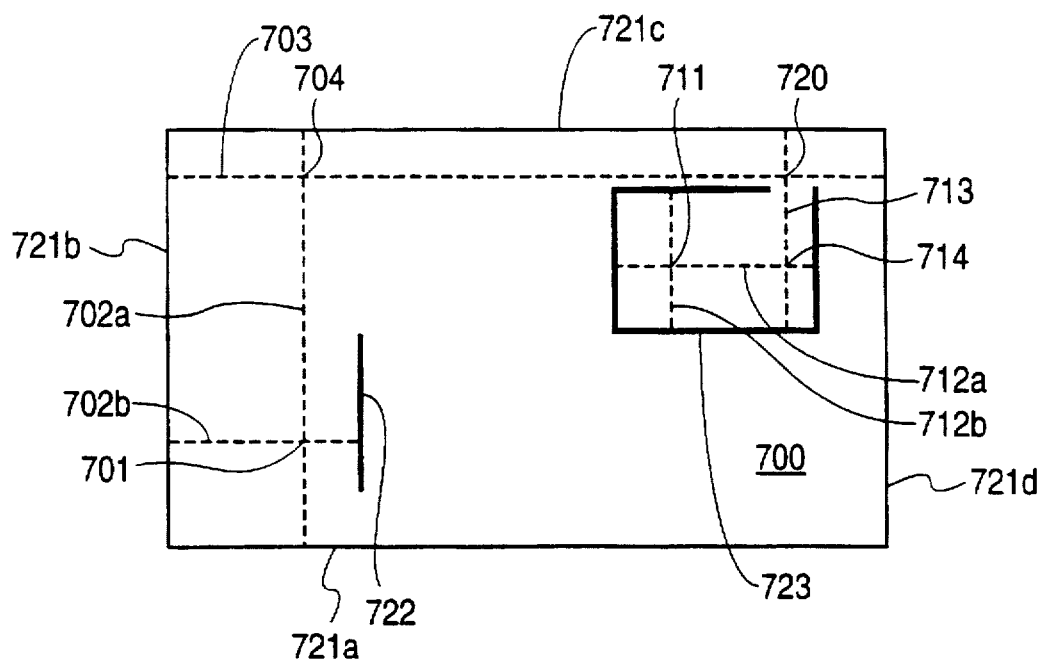
FIG. 7 is a simplified plan view of a die surface illustrating a routing method that can be used with the invention to perform area-based detailed routing.

FIG. 7 is a simplified plan view of a die surface 700 illustrating a line-probe routing method that can be used with the invention to perform area-based detailed routing. Line-probe routing is well known and is described, for instance, in the Preas and Lorenzetti reference discussed above. A brief description is given here to illustrate the technique.

For each of two pins to be connected, e.g., pins 701 and 711, a line is extended in each of four orthogonal directions (for convenience, two are referred to as horizontal and two as vertical) from each pin. The lines extend until they encounter a routing obstruction, e.g., an existing routing line or an edge of the die. In FIG. 7, line 702a extends from pin 701 in opposite directions until the die edge 721a is encountered in one direction and the die edge 721c is encountered in the opposite direction. Line 702b extends in opposite directions from pin 701 until the die edge 721b is encountered in one direction and the trace 722 is encountered in the opposite direction. Likewise, line 712a extends from pin 711 in opposite directions until the trace 723 is encountered in each direction. Line 712b extends in opposite directions from pin 711 until the trace 723 is encountered in each direction.

When an obstruction is encountered, an escape point is chosen. Generally, an escape point is chosen in the direction that encountered an obstruction farthest from the pin (or, in later stages of the routing, the last escape point). The selection of escape points involves a number of considerations which are known to those skilled in the art. The escape point 704 for the pin 701 is shown on the line 702a. Likewise, the escape point 714 for the pin 711 is shown on the line 712a.

A line orthogonal to the line on which the escape point lies is extended from the escape point. In FIG. 7, the line 703 is extended from the escape point 704 and the line 713 is extended from the escape point 714. Escape points are determined and lines are extended in this fashion until one of the lines extending from one pin intersects a line extending from the other pin. The resultant path extending from one pin to another represents the interconnection between the pins. In FIG. 7, the lines 703 and 713 intersect at point 720, making a connection between pins 701 and 711 that extends sequentially along lines 702a, 703, 713 and 712a.

In previous channel-based and area-based layout techniques, routing information (i.e., the global routing paths) is passed from the global router to the detailed router. In one embodiment of the invention, after performing routing space estimation and adjustment, a detailed router is supplied only with information regarding the size of the die surface, the component placement, and the interconnections that must be made between components. This enables the area-based detailed router to achieve a solution in a less-constrained way, i.e., the solution space is larger than it would be if the routing was constrained by the global routing specification. At the same time, since the routing space estimation and adjustment step changed the routing resources as necessary, the area-based router is almost certain to find a routing solution. This approach is desirable where the routing results provided by the routing space estimation and adjustment technique are thought to be inadequate in some way.

In another embodiment of the invention, the routing results from the routing space estimation and adjustment, i.e., approximate paths of the interconnections, are passed to the area-based router. This approach is desirable where the routing results provided by the routing space estimation and adjustment technique are thought to be very good. Though the solution space for the area-based router is more constrained, this is overcome by the quality of the routing space estimation and adjustment results.

Figure 8:
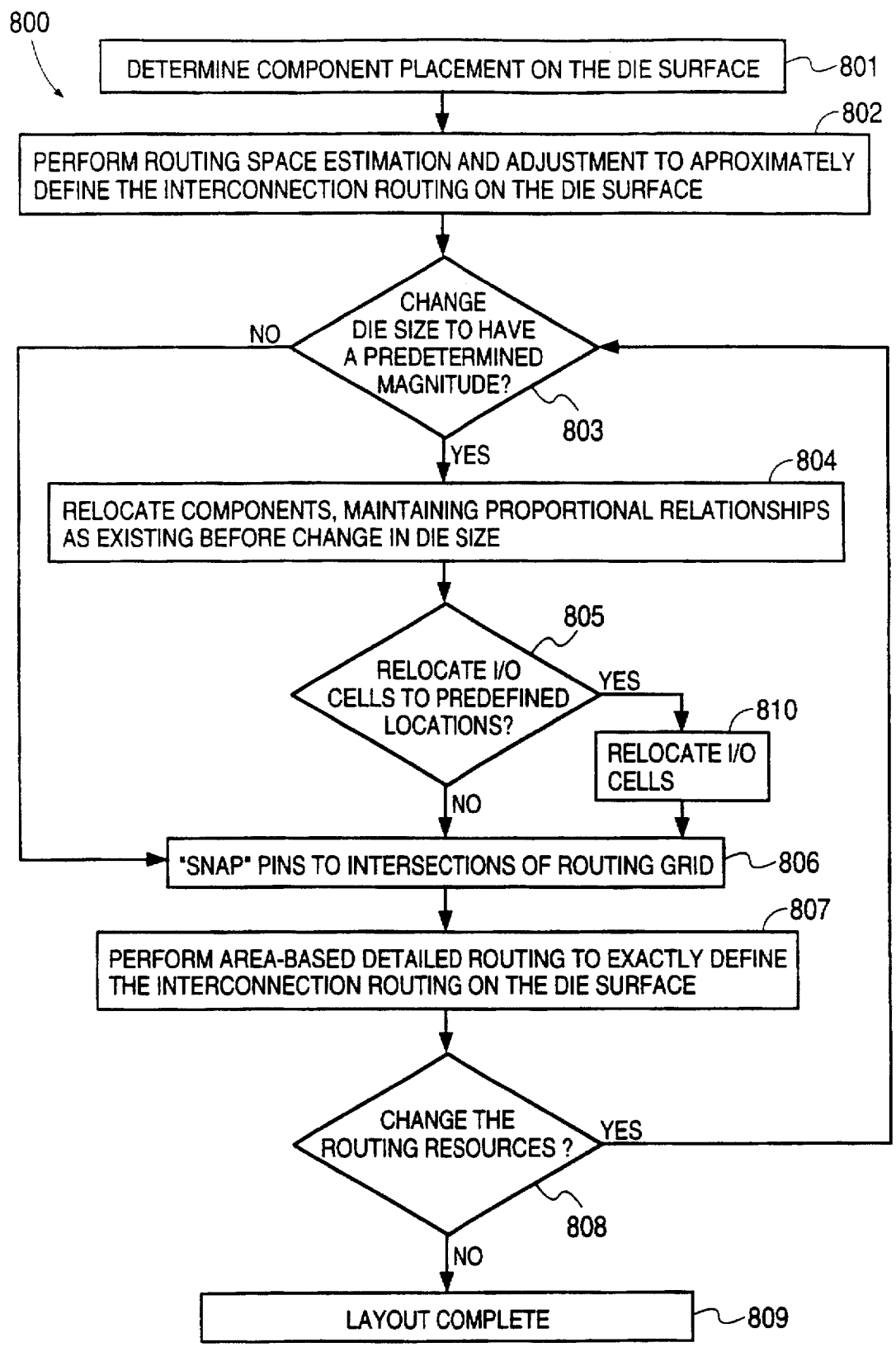
FIG. 8 is a block diagram of an integrated circuit layout method according to yet another embodiment of the invention.

FIG. 8 is a block diagram of an integrated circuit layout method 800 according to another embodiment of the invention. The steps 801, 802, 807 and 808, and the block 809 correspond to the steps 301, 302, 303 and 304, and the block 305 of the method 300 of FIG. 3 and are discussed above.

In the method 800, after the routing space estimation and adjustment step 802, a decision is made as to whether to change the magnitude of the die surface area to a predetermined magnitude, as shown by step 803. Typically, this is done when the integrated circuit layout must be implemented on a die of a given size.

If the magnitude of the die surface area is to be changed, then, in step 804, the components are relocated to accommodate the change in die size. The components are relocated so as to maintain the same proportional relationship between components as existed before the die size was changed. In other words, all cell spacings and channel heights are changed by the same percentage amount. For example, if the die surface area of a square die is decreased so that the new die surface area is 0.9025 times as large as the previously existing die surface area (i.e., the length of each side of the die is 0.95 times the previous length of the die sides), then each cell spacing and channel height is reduced to be 0.95 times as large as the previous cell spacing or channel height.

Sometimes when the die size is to be changed to a specific magnitude, it is also desired to maintain a given location of the I/O cells. This may be desirable, for instance, to ensure that a die of a specified size can be bonded to a leadframe of a particular size. Step 805 presents a choice as to whether to relocate the I/O cells to predefined locations or not. If the I/O cells are to be relocated, then, in step 810, the I/O cells are relocated to undo any changes in I/O cell location that result from the routing space estimation and adjustment step 802. Only the locations of the I/O cells are changed; internal cells are unaffected.

It is also possible as part of steps 805 and 810 to maintain the location of I/O pins for a block. The pins are simply moved to the locations of the pins as existent before the routing space estimation and adjustment step 802.

The capacity for developing a layout for a fixed die size and fixed I/O constraints is an advantageous feature of this embodiment of the method of the invention. While area-based layout also has this capacity, channel-based layout does not.

Whether or not the die size is changed (steps 803 and 804) and whether or not the I/O cells are relocated (steps 805 and 810), the cells and blocks are "snapped," as shown in step 806, after the routing space estimation and adjustment step 802. In area-based routing, a grid is superimposed on the die surface and interconnections are made between and through points of intersection on the grid. Thus, to maximize the likelihood of a routing solution being obtained by the area-based detailed routing step 808, i.e., maximize the pin access, pins must be located on grid intersections. This may not be the case after the routing space estimation and adjustment step 802 or the die size changing step 803. Consequently, some cells must be moved. This is accomplished by "snapping" the cells.

Figure 9A:
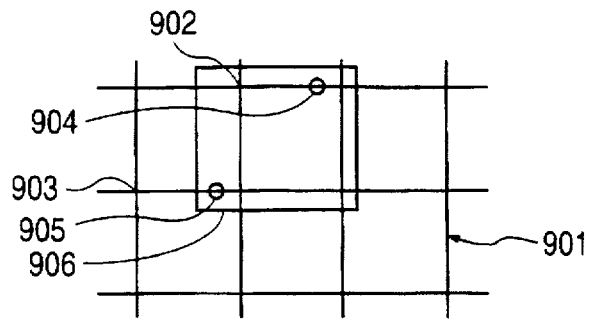
FIGS. 9A and 9B illustrate a method of snapping cells for use with the invention.
Figure 9B:
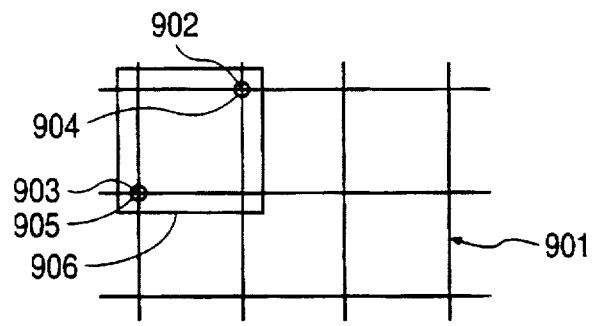

FIGS. 9A and 9B illustrate a method, for use with the invention, of snapping cells using a routing grid. FIG. 9A shows a routing grid 901 superimposed over a cell 906. The cell 906 includes two pins 904 and 905. FIG. 9B shows the cell 906 after the cell 906 has been snapped so that the pins 904 and 905 are located on the intersections 902 and 903, respectively, of the routing grid 901. The snapping is accomplished as described immediately below.

Moving in a single direction, each cell along a line of cells is evaluated to determine whether at least one pin is located on a grid intersection or other predefined point (in this latter case, the grid has a fixed relationship to such predefined point). If at least one pin is so located, the cell is not moved. Otherwise, the cell is moved, in the same direction in which the cells are being sequentially evaluated, so that the pin is located at the next closest grid intersection. This process is continued until all cells in a line have been evaluated and moved, if necessary, so that at least one pin lies on a grid intersection. Each line of cells is "snapped" in this manner. Typically, cells are only arranged in either vertical or horizontal lines, so that snapping must be done in only a single direction. However, generally, cells could be snapped in both vertical and horizontal directions.

Figure 10A:
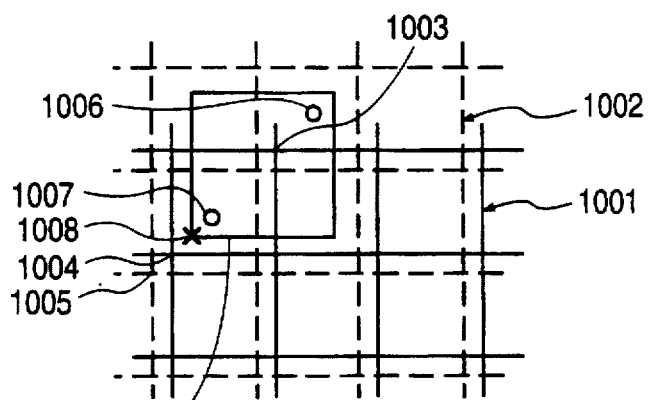
FIGS. 10A and 10B illustrate a method of snapping cells for use with the invention.
Figure 10B:
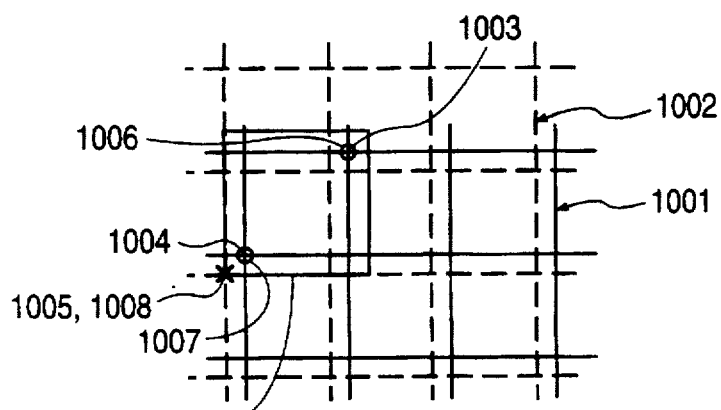

FIGS. 10A and 10B illustrate a method, for use with the invention, of snapping cells using a placement grid.

FIG. 10A shows a routing grid 1001 and a placement grid 1002 superimposed over a cell 1009. The cell 1009 includes two pins 1006 and 1007. FIG. 10B shows the cell 1009 after the cell 1009 has been snapped so that the pins 1007 and 1008 are located on the intersections 1003 and 1004, respectively, of the routing grid 1001.

The snapping according to this method is accomplished in a manner similar to that described above for FIGS. 9A and 9B. However, rather than using the routing grid 1001 as the basis for snapping the cell, the placement grid 1002 is used. A defined point on the cell (in the embodiment shown in FIGS. 10A and 10B, the corner 1008) is snapped as described above so that the defined point (corner 1008) is located on an intersection (in FIGS. 10A and 10B, intersection 1005) of the placement grid 1002. The locations of the pins 1006 and 1007 on the cell 1009 are specified in the integrated circuit design so that, when the corner 1008 of the cell 1009 is snapped to the intersection 1005 of the placement grid 1002, the pins 1006 and 1007 are located on the intersections 1003 and 1004, respectively, of the routing grid 1001. Note that, in the example shown in FIGS. 10A and 10B, the cell 1009 must be snapped in both the horizontal and vertical directions to locate the corner 1008 on the intersection 1005 of the placement grid 1002.

Figure 11:
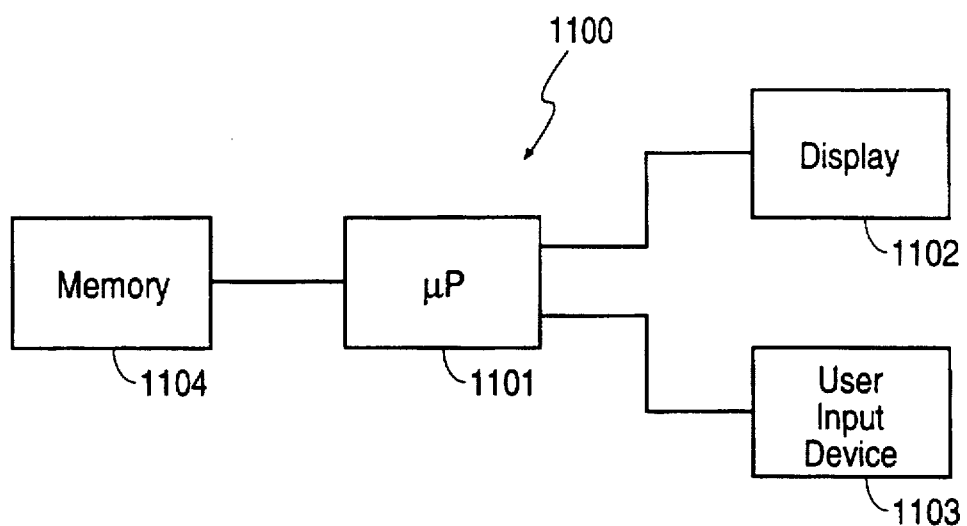
FIG. 11 is a block diagram illustrating a system according to the invention.

FIG. 11 is a block diagram illustrating a system 1100 according to the invention. The system 1100 includes a user input device 1103 (e.g., a keyboard or a mouse), a display device 1102 (e.g., a computer display screen), a processing device 1101 (e.g., a conventional microprocessor), and a memory device 1104 (e.g., a magnetic disk and a random access memory). Each of the devices 1101 through 1104 are conventional and are widely commercially available. The display device 1102 can be used to, for example, display the finally determined integrated circuit layout. The user input device 1103 can be used to, for example, control the manner in which the layout is displayed on the display device 1102. The processing device 1101 can be used to, for example, implement the steps of the above-described methods according to the invention. The memory device 1104 stores information used by the processing device 1101 as input (for example, information representing an integrated circuit design) and information provided by the processing device 1101 as output (for example, information representing an integrated circuit layout). The system 1100 can be implemented on, for instance, a digital computer.

Various embodiments of the invention have been described. The descriptions are intended to be illustrative, not limitative. Thus, it will be apparent to one skilled in the art that certain modifications may be made to the invention as described without departing from the scope of the claims set out below. For example, though integrated circuits are typically implemented on rectangular (including square) die, and the invention is described as applicable to rectangular die, the invention is applicable to integrated circuit layout on a die surface of any other contour, such as, for example, a circular contour.

We claim:

1. A method for determining an integrated circuit layout on a surface of a semiconductor die, the integrated circuit including a plurality of components, at least two of the components including at least one pin, the type and structure of the components and the interconnections between pins of various components being predefined, the method comprising the steps of:

determining a first component placement on the die surface, wherein:
each component is represented as a block or one of a plurality of cells in a row of cells;
a distance between adjacent cells within a row defines a cell spacing; and
a region between defined locations of adjacent blocks and/or cell rows defines a channel having a channel height; and routing each interconnection, the step of routing further comprising the steps of:
performing routing space estimation and adjustment to approximately define the routing demand, wherein, after the routing space estimation and adjustment step, the area of the die surface, each channel height and each cell spacing have a particular magnitude that together define a second component placement; and performing area-based detailed routing to exactly define the path of each interconnection, the magnitude of the die surface area after the detailed routing step remaining unchanged from the magnitude of the die surface area before the detailed routing step.

2. A method as in claim 1, wherein the step of performing routing space estimation and adjustment further comprises the step of adjusting one or more channel heights.

3. A method as in claim 1, wherein the step of performing routing space estimation and adjustment further comprises the step of performing gridded channel-based global routing.

4. A method as in claim 1, wherein the step of performing routing space estimation and adjustment further comprises the step of performing gridless channel-based global routing.

5. A method as in claim 1, wherein only the second component placement, interconnections between pins and the magnitude of the die surface area after the routing space estimation and adjustment step are supplied as input information for the area-based detailed routing step.

6. A method as in claim 1, wherein the approximate paths of the interconnections are supplied from the routing space estimation and adjustment step as input information for the area-based detailed routing step.

7. A method as in claim 1, further comprising, after the steps of performing routing space estimation and adjustment and area-based detailed routing, iteratively performing the steps of:

changing the magnitude of the area of the die surface; and
performing a subsequent area-based detailed routing to exactly define the path of each interconnection on the die surface, the results of the subsequent step of performing area-based detailed routing replacing the results of the previous step of performing area-based detailed routing.

8. A method as in claim 7, further comprising, before a subsequent step of performing area-based detailed routing, the step of changing one or more channel heights.

9. A method as in claim 8, further comprising, before a subsequent step of performing area-based detailed routing, the step of changing one or more cell spacings.

10. A method as in claim 7, further comprising, before a subsequent step of performing area-based detailed routing, the step of changing one or more cell spacings.

11. A method as in claim 1, further comprising, after the steps of performing routing space estimation and adjustment and area-based detailed routing, iteratively performing the steps of:

changing one or more channel heights; and
performing a subsequent area-based detailed routing to exactly define the path of each interconnection on the die surface, the results of the subsequent step of performing area-based detailed routing replacing the results of the previous step of performing area-based detailed routing.

12. A method as in claim 11, further comprising, before a subsequent step of performing area-based detailed routing, the step of changing one or more cell spacings.

13. A method as in claim 1, further comprising, after the steps of performing routing space estimation and adjustment and area-based detailed routing, iteratively performing the steps of:

changing one or more cell spacings; and performing a subsequent area-based detailed routing to exactly define the path of each interconnection on the die surface, the results of the subsequent step of performing area-based detailed routing replacing the results of the previous step of performing area-based detailed routing.

14. A method as in claim 1, wherein the step of performing routing space estimation and adjustment further comprises the steps of:

defining the location of one or more vertices for each channel;

assigning each pin to a vertex; and routing each interconnection between the vertices associated with the pins being interconnected.

15. A method as in claim 14, wherein the step of routing each interconnection between the vertices further comprises maze routing.

16. A method as in claim 14, wherein the step of routing each interconnection between the vertices further comprises line-probe routing.

17. A method as in claim 1, wherein the step of performing routing space estimation and adjustment further comprises the steps of:

dividing the die surface into a plurality of rectangles;

assigning each pin to a rectangle; and routing each interconnection between the rectangles associated with the pins being interconnected.

18. A method as in claim 17, wherein the step of routing each interconnection between the rectangles further comprises maze routing.

19. A method as in claim 1, further comprising, after the step of performing routing space estimation and adjustment, the steps of:

determining, for each component, whether the component is at a location that enables interconnection to be made to the pin or pins of the component; and for each component that is not at such a location, relocating the component to a location that enables interconnection to be made to the pin or pins of the component.

20. A method as in claim 19, wherein:

the step of determining further comprises the steps of:
defining a routing grid; and
evaluating at least one pin of each component to determine whether the pin is located on an intersection of the routing grid; and the step of relocating further comprises the step of moving the component such that at least one pin of the component is located on an intersection of the routing grid.

21. A method as in claim 19, wherein:

the step of determining further comprises the steps of:
defining a routing grid and a placement grid; and
evaluating a defined point of each component to determine whether the defined point is located on an intersection of the placement grid; and the step of relocating further comprises the step of moving the component such that the defined point is located on an intersection of the placement grid.

22. A method as in claim 19, further comprising, after the steps of performing routing space estimation and adjustment and area-based detailed routing, iteratively performing the steps of:

changing the magnitude of the area of the die surface such that the component placement is changed; and determining, for each component, whether the component is at a location that enables interconnection to be made to the pin or pins of the component;

for each component that is not at such a location, relocating the component to a location that enables interconnection to be made to the pin or pins of the component; and performing a subsequent area-based detailed routing to exactly define the path of each interconnection on the die surface, the results of the subsequent step of performing area-based detailed routing replacing the results of the previous step of performing area-based detailed routing.

23. A method as in claim 1, further comprising, after the step of performing routing space estimation and adjustment, the step of changing the magnitude of the die surface area, if necessary, to have a predetermined magnitude, the step of changing the magnitude of the die surface area further comprising the step of relocating each component so as to maintain the same proportional relationship between the magnitudes of the cell spacings and the channel heights before and after the step of changing the magnitude of the die surface area.

24. A method as in claim 23, further comprising, after the step of changing the magnitude of the die surface area, the steps of:

determining, for each component, whether the component is at a location that enables interconnection to be made to the pin or pins of the component; and for each component that is not at such a location, relocating the component to a location that enables interconnection to be made to the pin or pins of the component.

25. A method as in claim 23, further comprising, after the step of changing the magnitude of the die surface area, the step of relocating each input cell or pin and output cell or pin to a predefined location.

26. A method as in claim 25, further comprising, after the step of relocating each input cell or pin and output cell or pin to a predefined location, the steps of:

determining, for each component, whether the component is at a location that enables interconnection to be made to the pin or pins of the component; and for each component that is not at such a location, relocating the component to a location that enables interconnection to be made to the pin or pins of the component.

27. A method as in claim 1, wherein the step of performing routing space estimation and adjustment further comprises the step of adjusting one or more cell spacings.

28. A system for determining an integrated circuit layout on a surface of a semiconductor die, the integrated circuit including a plurality of components, at least two of the components including at least one pin, the type and structure of the components and the interconnections between pins of various components being predefined, the system comprising:

means for determining a first component placement on the die surface, wherein:
each component is represented as a block or one of a plurality of cells in a row of cells;
a distance between adjacent cells within a row defines a cell spacing; and
a region between defined locations of adjacent blocks and/or cell rows defines a channel having a channel height; and means for routing each interconnection, the means for routing further comprising:

means for performing routing space estimation and adjustment to approximately define the routing demand, the performance of routing space estimation and adjustment resulting in the determination of a particular magnitude for the area of the die surface, each channel height and each cell spacing that together define a second component placement; and means for performing area-based detailed routing to exactly define the path of each interconnection, the magnitude of the die surface area after the detailed routing remaining unchanged from the magnitude of the die surface area before the detailed routing.

* * * * *